United States Patent [19]
Nakasuji

[11] Patent Number: 6,066,853
[45] Date of Patent: May 23, 2000

[54] ELECTRON-OPTICAL SYSTEM EXHIBITING REDUCED ABERRATION

[75] Inventor: Mamoru Nakasuji, Yokohama, Japan

[73] Assignee: Nikon Corporation, Tokyo, Japan

[21] Appl. No.: 09/112,107

[22] Filed: Jul. 8, 1998

[30] Foreign Application Priority Data

Jul. 8, 1997 [JP] Japan ................................ 9-196408

[51] Int. Cl.[7] .................................................. H01J 37/30
[52] U.S. Cl. ............. 250/398; 250/492.23; 250/396 ML
[58] Field of Search ..................... 250/398, 492.2, 250/492.23, 396 ML

[56] References Cited

U.S. PATENT DOCUMENTS

| | | | |
|---|---|---|---|
| 5,635,719 | 6/1997 | Petric | 250/492.23 |
| 5,689,117 | 11/1997 | Naksuji | 250/398 |
| 5,747,819 | 5/1998 | Nakasuji | 250/492.23 |
| 5,757,010 | 5/1998 | Langner | 250/492.23 |
| 5,773,837 | 6/1998 | Nakasuji | 250/398 |
| 5,773,838 | 6/1998 | Nakasuji | 250/398 |
| 5,793,048 | 8/1998 | Petric et al. | 250/398 |
| 5,912,469 | 6/1999 | Okino | 250/492.23 |

OTHER PUBLICATIONS

Hosokawa, "Practical Feasibility of the Multistage Deflection Theory," *J. Vac. Sci. Technol.* 13:1050–1054 (1995).

*Primary Examiner*—Bruce C. Anderson
*Attorney, Agent, or Firm*—Klarquist Sparkman Campbell Leigh & Whinston, LLP

[57] ABSTRACT

Electron-optical systems are disclosed in having operating parameters that are quantitatively optimized in a short period of time. The systems comprise multiple deflectors that diminish off-axis aberrations. The deflectors are situated in a two-stage projection lens. The dimensions of the main field which in subfields are selected by electron-beam deflection are set to 10 mm or less. The dimensions of each transfer subfield on the surface of the substrate are set to $(500 \,\mu m)^2$ to $(750 \,\mu m)^2$, and the mask-to-specimen distance is set to 600 mm or less.

17 Claims, 4 Drawing Sheets

ELECTRON-OPTICAL SYSTEM EXHIBITING REDUCED ABERRATION

FIELD OF THE INVENTION

This invention pertains to electron-optical systems in projection-transfer apparatus used for transferring a pattern, defined by a mask, to a sensitive substrate (e.g., semiconductor wafer) using an electron beam. In particular, the invention pertains to electron-optical systems in projection-transfer apparatus used for forming, on a substrate, a high-density, intricate pattern having line widths (feature sizes) of 0.1 µm or less.

BACKGROUND OF THE INVENTION

Microlithographic projection-exposure using an electron beam is highly accurate and offers prospects of greater resolution of projected pattern features than optical microlithography. However, this technique disadvantageously exhibits low throughput. Increasing the throughput of electron-beam microlithography has become the subject of much intensive development.

Contemporary projection-exposure systems perform exposure of a wafer by, e.g., cell projection, character projection, or block exposure. For example, an entire wafer is exposed by repeated transfer-exposure of small, repetitive circuit patterns (approximately $(5 \mu m)^2$ in area as formed on the wafer) using a single small pattern segment as an exposure unit. The pattern segment is defined on a mask that also defines other exposure units each comprising a respective pattern segment. However, such a pattern-exposure system as applied to wafer exposure required for production of semiconductor integrated circuit devices (e.g., DRAMs, etc.), tends to exhibit low throughput, no more than about 10 wafers processed per hour.

Demagnifying projection-transfer apparatus employing an electron beam have been proposed that purportedly greatly improve throughput compared to the types of projection-exposure systems summarized above. In such demagnifying projection-transfer apparatus, an electron beam is irradiated onto a mask defining a circuit pattern for an entire semiconductor chip. An image of the pattern in the irradiated area is demagnified by a two-stage projection lens and transferred to a sensitive substrate. (See, e.g., Japan Kôkai Patent Document No. HEI 5-160012). However, simultaneously irradiating an entire chip region of the mask by the electron beam, which transfers the entire chip pattern in one shot, results in the pattern being transferred with poor accuracy due to aberrations.

To reduce aberrations, a circuit pattern on the mask can be divided ("segmented") into multiple field segments that, in turn, are further divided into subfields. The subfields are individually transferred from the mask to the substrate in a sequential or other ordered manner. During exposure of each subfield, the performance of the electron-optical system is changed for each subfield as required to reduce aberrations. The images of the mask subfields (i.e., "transfer subfields") on the substrate are aligned and joined ("stitched") together. Reference is made to, e.g., U.S. Pat. No. 5,260,151, incorporated herein by reference.

Off-axis aberrations can be minimized in segmented projection-transfer electron-beam exposure apparatus by using axis-shifting electromagnetic lenses, such as MOL and/or VAL lenses ("MOL" denotes a Moving Objective Lens, Ohiwa et al., *Electron Commun. Jpn.* 54-B:44 (1971), and "VAL" denotes a Variable Axis Lens, Pfeiffer, et al., *Appl. Phys. Lett.* 39(9):1 (Nov., 1981)).

Third-order or three-dimensional geometric optical aberrations can be canceled by providing multiple deflectors in the projection optical system, Hosokawa, *Optik* 56(1):21–30 (1980).

According to conventional methods, electron-optical systems are designed by estimating various parametric values (e.g., mask-to-substrate distance, main-field dimensions, and subfield dimensions) and calculating, by simulations, the aberrations and space-charge effects impressed on the main field overall, then determining whether the specifications are met by the simulation. This has proved to be impractical and has achieved unsatisfactory results. For example, with respect to the electron lenses and/or mask-to-substrate distances, it is necessary to perform calculations to eliminate (or diminish) off-axis aberrations by means of deflectors. This requires a large amount of design time. That is, conventionally, specifications, e.g., beam current, field segment size, subfield size, etc. are defined prior to exposure. The specific design parameters, such as mask-to-wafer distance and beam angle, are set based on the defined specifications. Exposure is performed using the above design parameters and resulting aberrations are measured. If there are no significant aberrations in the resulting image, the design parameters are set. If aberrations exist, the design parameters are changed and the correction process is performed again. Since such calculations cannot be performed using all the numerous design parameters that must be considered simultaneously, the design results typically exhibit operational parameters that deviate substantially from optimal values.

SUMMARY OF THE INVENTION

In view of the foregoing, an object of this invention is to provide electron-optical systems having design or operational parameters that are optimized by performing calculations that require little time. Another object is to provide electron-optical systems in which the various design parameters are optimized.

An electron-optical system according to a preferred embodiment of the invention is used with a mask defining multiple fields. Projection-transfer of a pattern portion defined by a particular field on the mask is performed while changing at least one operating parameter of the electron-optical system at the particular field. Specifically, the distance between the mask and the substrate and/or the length-by-width dimensions of the field, as situated on the optical axis of the electron-optical system, is optimized based on (i) a relationship between geometric optical aberrations and chromatic aberrations, exhibited by the electron-optical system, when projecting the particular field, and (ii) the space-charge effect exhibited by the electron beam passing through the electron-optical system from the region on the mask to the substrate. The electron-optical system comprises first and second projection lenses each having associated therewith at least one deflector operable to diminish or cancel off-axis aberrations.

Each field on the mask can be divided into "subfields," such as by use of a shaped beam having transverse dimensions equal to the desired subfield transverse dimensions. In such an instance, the electron-optical system according to the invention can be used to projection-transfer the mask pattern subfield-by-subfield to corresponding transfer subfields on the substrate. Such projection-transfer can be performed while changing the design or operating parameters of the electron-optical system at each subfield. Preferably, each transfer subfield on the substrate has a dimension (length×width) of $(500 \, \mu m)^2$ to $(750 \, \mu m)^2$. Also, the mask-to-specimen distance is preferably 600 mm or less. Each projection lens preferably has associated therewith multiple deflectors that are operable to diminish or cancel off-axis aberrations.

The foregoing and additional features and advantages of the invention will be more readily apparent from the following detailed description, which proceeds with reference to the accompanying drawings.

BRIEF DESCRIPTION OF THE DRAWINGS

FIG. 3(a): L=400 mm, FIG. 3(b): L=600 mm, FIG. 3(c): L=800 mm, and FIG. 3(d): L=1000 mm.

DETAILED DESCRIPTION

In methods and apparatus according to this invention, an electron beam is used to project a pattern, defined by a mask, onto a sensitized surface of a suitable substrate such as a silicon wafer. In propagating from the mask to the substrate, the electron beam passes through an electron-optical system. The mask is divided into multiple fields, and each field is subdivided into multiple subfields. Within each field, the constituent subfields are exposed individually by appropriately deflecting the electron beam. As the electron beam passes through the electron-optical system, certain operating parameters of the electron-optical system are adjusted as required. Specifically, individual electron lenses in the electron optical system comprise one or more deflectors that can be energized to diminish or cancel off-axis aberrations.

Each field on the mask has an area of preferably 10 mm² (i.e., the field measures 1 mm wide and 10 mm in length) or less, each subfield has an area of preferably $(500 \, \mu m)^2$ to $(750 \, \mu m)^2$, and the mask-to-substrate distance is preferably 600 mm or less. The field dimension is preferably no larger than 10 mm in order to satisfactorily minimize fifth-order aberrations of the electron optical system that tend to arise as the number of deflectors associated with the electron lenses increases. Such aberrations include spherical aberration, image-plane distortion, astigmatism, coma radius (r), and coma length (L), chromatic aberrations including axial achromatism and transverse chromatic aberration, and space-charge effects that can cause beam blur by electron-electron collisions in the beam.

In an electron-optical system according to the invention, the deflectors that are operable to diminish or cancel these off-axis aberrations can be deflectors associated with MOL, VAL, MTP (Moving Trajectory Projection), or with aberration-cancellation methods that utilize multiple deflectors. An MTP system is is a projection-optical system, incorporating both symmetric magnetic doublet (SMD) and VAL operating principles as disclosed in Japanese published patent application no. HEI 9-124723, incorporated herein by reference.

Figure 1:
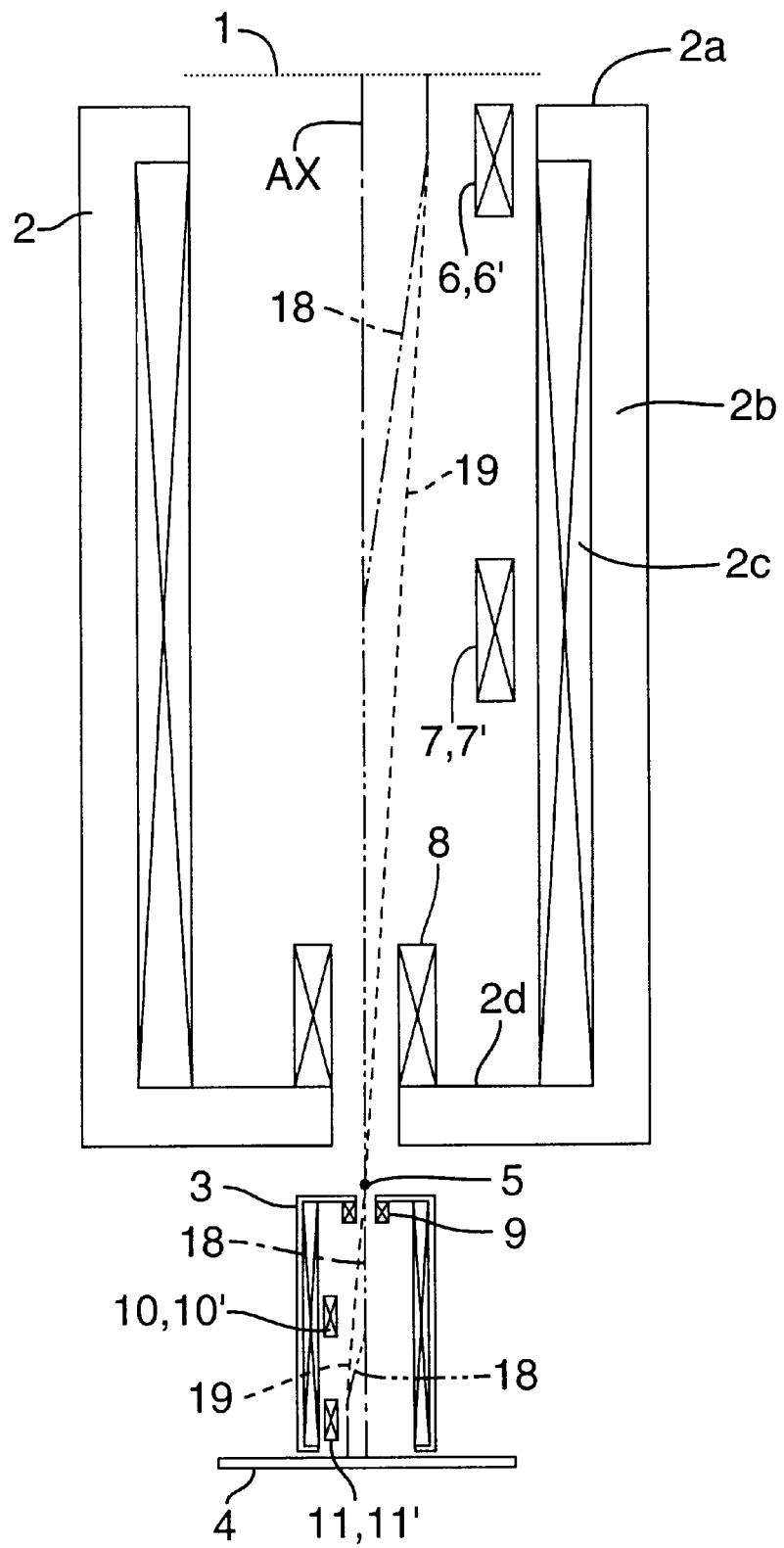
FIG. 1 is a schematic elevational view of a preferred embodiment of an electron-beam projection-optical system according to the invention.

FIG. 1 depicts an electron optical system according to a first example embodiment. A mask 1, situated at the top of the figure, is irradiated by an electron beam from an upstream illumination-optical system (not shown). After passing through the mask 1, the electron beam passes through a first projection lens 2 and a second projection lens 3 to a sensitized substrate 4. The first and second projection lenses 2, 3 are arranged along an optical axis AX and collectively constitute a two-stage projection lens. The upstream illumination-optical system comprises an electron gun that generates the electron beam, condenser lenses, and a subfield-selection deflector.

In the FIG. 1 embodiment, the first projection lens 2 comprises a coil 2c wound on the inner circumference of a radially symmetrical pole piece 2b configured with an inward-facing, C-shaped cross-section. The pole piece 2b comprises an upstream pole 2a and a downstream pole 2d, each extending radially toward the optical axis AX. The upstream and downstream poles 2a, 2d facilitate formation of a magnetic field defined by lines of magnetic force that extend between the poles 2a, 2d through the first projection lens 2 along the optical axis AX. Along the axis AX in a downstream direction, the magnitude of the magnetic field increases at the upstream pole 2a and decreases at the downstream pole 2d.

Further with respect to the FIG. 1 embodiment, a first axis-shifting deflector 6 is situated at the upstream pole 2a toward the optical axis AX. Second and third axis-shifting deflectors 7 and 8, respectively, are situated downstream of the first axis-shifting deflector 6 in the space defined by the first projection lens 2. The second axis-deflecting deflector 7 is situated at a midlength of the first projection lens 2. The third axis-deflecting deflector 8 is situated immediately upstream of the downstream pole 2d. First and second beam-deflecting deflectors 6', 7' are individually situated at the same respective positions as the second and third axis-shifting deflectors 6, 7. Depending upon the trajectory path, only one or two axis-shifting deflectors and one or two beam-shifting deflectors may be needed. For trajectory path 19, a system having two axis-shifting deflectors and one beam-shifting deflector, is preferred. For a trajectory path following principal ray 18, one axis-shifting deflector and two beam-shifting deflector are preferred.

Each of the axis-shifting deflectors 6, 7, 8 forms a magnetic field $Y_n(r, z)$ (wherein the subscript "n" denotes the deflector number) corresponding to $dB(z)/dz$ with respect to the magnetic field B formed by the first projection lens 2.

The second projection lens 3 in the FIG. 1 embodiment has a configuration that is a proportionately smaller (according to the demagnification ratio) and inverted version of the first projection lens 2. The second projection lens 3 comprises a pole piece 3b having an upstream pole 3a and a downstream pole 3d. A coil 3b is wound on the inner circumference of the radially symmetrical pole piece 3b.

A crossover 5 is formed at a point on the optical axis AX immediately upstream of the upstream pole 3a of the second projection lens 3. At the position of the crossover 5, the axial mask-to-substrate distance is divided by the demagnification ratio of the electron-optical system. At the crossover 5, an image is formed of a crossover of the electron gun of the illumination-optical system.

Further with respect to the FIG. 1 embodiment, fourth, fifth, and sixth axis-shifting deflectors 9, 10, 11, respectively, are situated inside the second projection lens 3 in a manner that is a demagnified mirror image of the manner in which the first, second, and third axis-shifting deflectors 6, 7, 8, respectively, are situated inside the first projection lens 2. The second projection lens 3 also includes third and fourth beam-deflecting deflectors 10', 11' situated at the same positions as the fifth and sixth axis-shifting deflectors 10, 11, respectively.

The substrate 4 (e.g., semiconductor wafer coated with a sensitive resist) is placed downstream of the second projection lens 3.

The behavior of an electron beam passing through the electron-optical system of FIG. 1 will be explained for the case in which lens axis-shifting has been employed, beginning with a moving trajectory projection path (or an MTP path). An electron beam is irradiated on a preselected region of the mask 1. The image of the irradiated region of the mask is demagnified and projected by the first and second projection lenses 2, 3, respectively, onto the surface of the specimen 4. In FIG. 1, the irradiated region (irradiated subfield) of the mask is laterally displaced from the optical axis AX. From the irradiated surface of the mask 1, a principal ray 18 extends in a downstream direction perpendicularly to the mask surface. The principal ray 18 is deflected toward the optical axis AX by the first beam-deflecting deflector 6', and intersects the optical axis AX at mid-length of the second beam-deflecting deflector 7'. The second beam-deflecting deflector 7' deflects the principal ray 18 such that the principal ray 18 extends downstream from the second beam-deflecting deflector 7' along the optical axis AX.

Electrical current delivered as required to one or more of the axis-shifting deflectors 6, 7, 8, generates respective magnetic fields $Y_6(r,z)$, $Y_7(r,z)$, $Y_8(r,z)$ that locally shift the electron-optical axis of the first projection lens. As a result, the principal ray assumes a path 19 that follows the electron-optical axis, as locally shifted, of the first projection lens 2.

The principal ray 18, caused by one or more of the axis-shifting deflectors 6, 7, 8 to assume the path 19, passes through the crossover 5 and enters the second lens 3. The principal ray 18 is deflected laterally away from the optical axis AX by the third beam-deflecting deflector 10', which is in a conjugate position relative to the second beam-deflecting deflector 7'. The principal ray 18 then intersects, at midlength of the fourth beam-deflecting deflector 11', a perpendicular line extending upward parallel to the optical axis from the exposure position ("transfer subfield" corresponding to the irradiated mask subfield) on the substrate 4. The fourth beam-deflecting deflector 11' (which is in a conjugate position relative to the first beam-deflecting deflector 6') deflects the principal ray 18 and causes the beam to propagate parallel to the optical axis to the substrate 4. In the second projection lens 3, as in the first projection lens 2, the electron-optical axis is locally shifted, as required, by one or more of the fourth, fifth, and sixth axis-shifting deflectors 9, 10, 11, respectively, to cause the principal ray to propagate along the path 19. The path 19 follows the electron-optical axis, as locally shifted, of the second projection lens 3.

The electron-beam path 19 is now explained for a situation in which, e.g., a layer is being projection-exposed (using the electron-optical system of FIG. 1) at especially high accuracy onto the surface of the substrate, or the projected pattern includes contact-hole features in which the fill ratio (or filling factor) of the pattern is small. In such situations, the axis-shifting deflectors 7, 8, 9, 10 are disabled. That is, when the fill ratio is small, the beam current and space-charge effect are small, and thus, a small beam angle is acceptable. Accordingly, a lens having fewer deflectors is sufficient and deflectors 7, 8, 9, 10 are unnecessary. Each irradiated portion of the mask can be an individual main field or an individual subfield. The principal ray passing through the mask 1 is acted upon only by the axis-shifting deflectors 6, 11 and by the respective beam-deflecting deflectors 6', 11', taking the path denoted by the dotted line 19.

Figure 5:
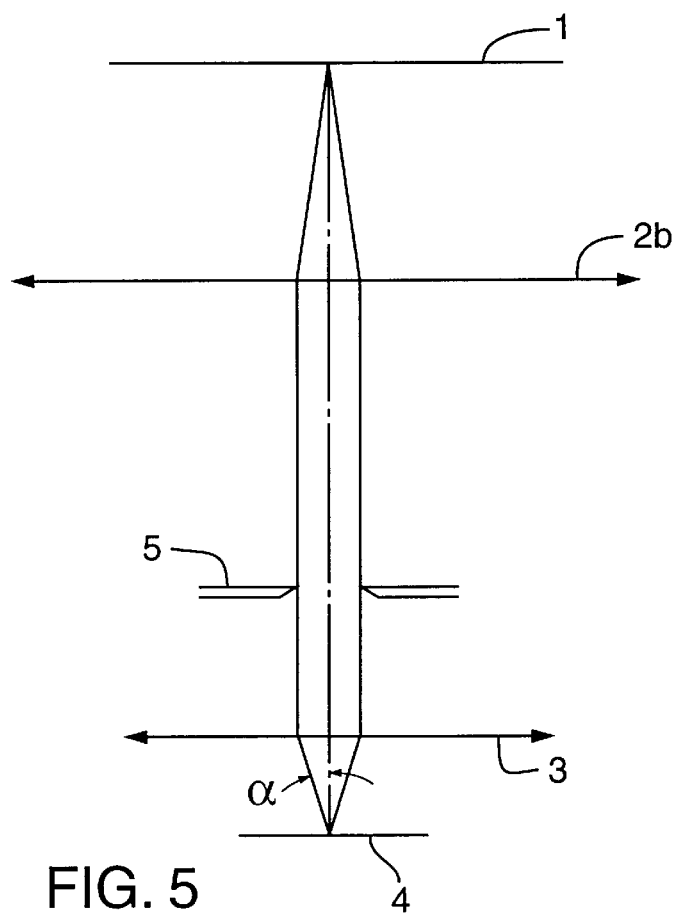
FIG. 5 is a partial schematic elevational view of the electron-beam projection-optical system shown in FIG. 1.

Optimizing the various design parameters of the electron-optical system, considering the aberrations of the electron-optical system and any space-charge effects, can be performed as follows. Computer programs are commercially available (e.g., OPTICS by Munros Electron Beam Software Ltd., London, England) that calculate third-order aberration coefficients for a mask subfield, located on the optical axis, from data concerning the mask-to-substrate distance and any electron lenses that are employed. Using such a program, the third-order aberration coefficients can be calculated at a desired accuracy. The aberration coefficient can be used, together with data concerning subfield dimensions and a ratio of energy amplitude to acceleration voltage applied to the lenses of the electron-optical system, to calculate the relationship of geometric optical aberrations and chromatic aberrations on the aperture half-angle α (see FIG. 5). The aperture half-angle a is equal to the aperture radius divided by the focal length of the second projection lens when the aperture is fully illuminated. Whenever the crossover radius at the aperture is smaller than the aperture radius, the aperture half-angle is equal to the radius of the crossover at the aperture divided by the focal length of the second projection lens.

Figure 4:
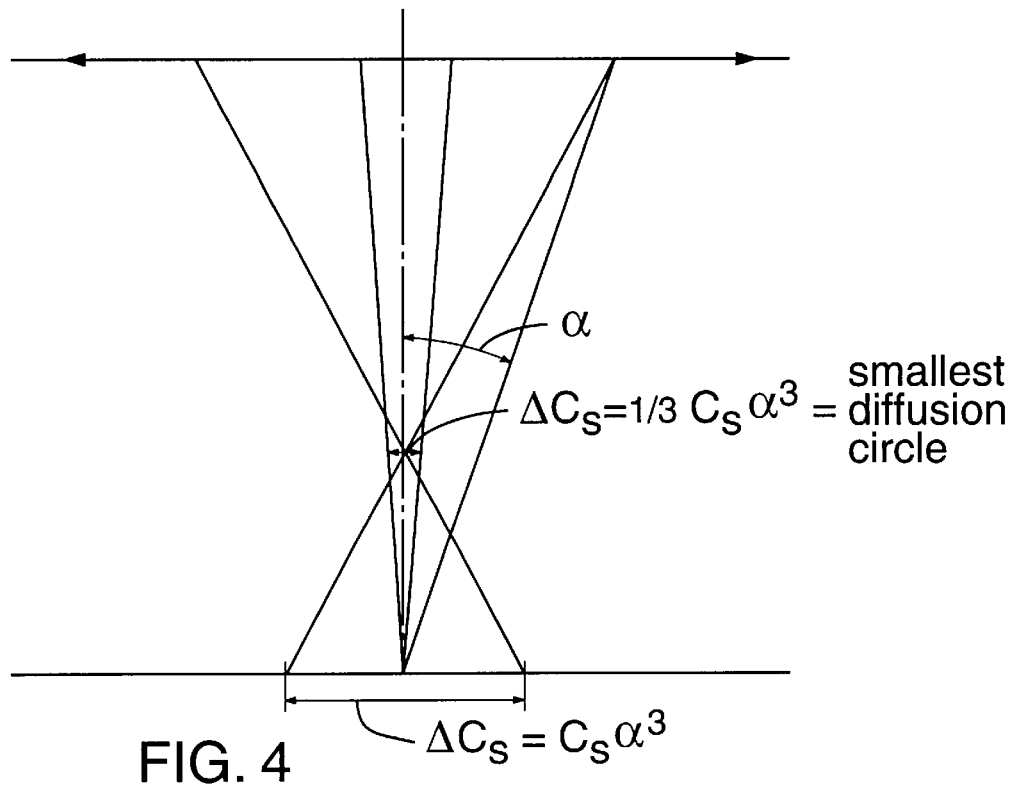
FIG. 4 is a graph illustrating the spherical aberration value.

Plots showing the dependency of beam blur on the aperture half angle at various subfield dimensions are shown in FIGS. 2(a)–2(d). Specifically, FIG. 2(a) is a plot of such data for a subfield dimension of $(250\ \mu m)^2$, FIG. 2(b) is a plot of such data for a subfield dimension of $(500\ \mu m)^2$, FIG. 2(c) is a plot of such data for a subfield dimension of $(750\ \mu m)^2$, and FIG. 2(d) is a plot of such data for a subfield dimension of $(1000\ \mu m)^2$. In each figure, the mask-to-substrate distance is 600 mm, the abscissa is the aperture half-angle (mrad), and the ordinate is the transfer-image blur (nm). In FIGS. 2(a)–2(d), the following plots are shown:

plot 31: spherical aberration using the value at the smallest diffusion circle that is not a Gaussian surface. (Referring to FIG. 4, the spherical aberration coefficient $C_S$ preferably is calculated using appropriate commercially available software (e.g., ABER by Munros Electron Beam Software Ltd., London, England). The smallest diffusion circle is equal to $\Delta C_S = \frac{1}{3} C_S \alpha^3$).

plot 32: coma length plot 33: coma radius plot 34: image-plane distortion plot 35: astigmatism plot 36: axial chromatic aberration plot 37: the value T of the sum of these aberrations squared, i.e., $T_{37} = (\Delta_{31}^2 + \Delta_{32}^2 + \Delta_{33}^2 + \Delta_{34}^2 + \Delta_{35}^2 + \Delta_{36}^2)^{1/2}$.

Whenever the specification value for beam blur is 100 nm, the beam defocus or blur allowance B for electron-electron interaction is derived from the following equation:

$$B^2 = 100^2 - T^2$$

The α-dependency of the beam-blur allowance B is indicated by the curve 38 shown in each of FIGS. 2(a)–2(d).

Computer programs are also commercially available (e.g., BOERSCH by MEBS Co., London, England) for calculating beam blur due to electron-electron interaction (space-charge effects) using Monte Carlo simulations. By way of example, representative results of such calculations are denoted by the curve 39 in FIGS. 2(*a*)–2(*d*), performed using the respective subfield dimensions at a mask-to-substrate distance of 600 mm. Thus, pattern transfer is possible, with no more than 100 nm of beam blur, at a beam current of 30 μA under conditions in which curve 38 is above the curve 39.

Figure 2:
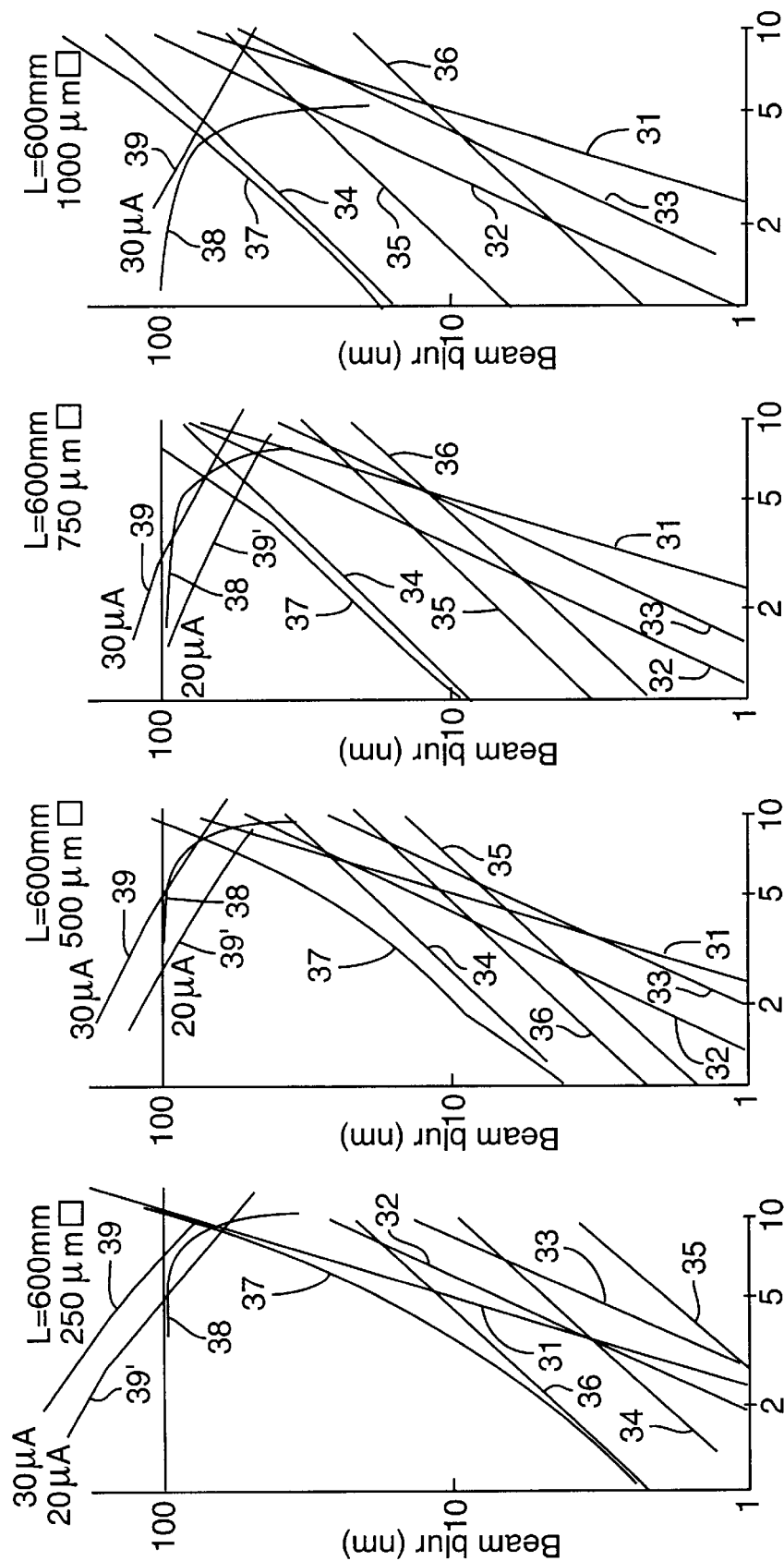
FIGS. 2(a)–2(d) are graphs showing the dependency of beam defocusing or blurring on the aperture half-angle whenever the transfer subfield dimensions are $(250 \, \mu m)^2$, $(500 \, \mu m)^2$, $(750 \, \mu m)^2$, and $1000 \, \mu m)^2$, respectively, with a mask-to-substrate distance of 600 mm.

FIGS. 2(*c*) and 2(*d*) illustrate representative situations in which a portion of the curve 38 is situated above the curve 39 (the respective portion being indicated by the bold portion of the curve 38 in each of these figures). Specifically, the curve 38 is situated above the curve 39 over a limited range of aperture half-angle α whenever the subfield dimensions are $(500 \mu m)^2$ (FIG. 2(*b*)) and $(750 \mu m)^2$ (FIG. 2(*c*)), the beam current is 30 μA, and the beam blur is about 100 nm. However, at subfield dimensions of $(250 \mu m)^2$ (FIG. 2(*a*)) and $(1000 \mu m)^2$ (FIG. 2(*d*)), the curve 38 is always below the curve 39, and the foregoing conditions are not met.

The curve 39', which is below the curve 39 in FIGS. 2(*a*)–2(*c*), is a plot of the magnitude of beam blur due to the space-charge effect whenever the beam current is 20 μA. In such an instance, the space-charge effect diminishes in proportion to the drop in beam current, thereby decreasing the magnitude of beam blur. Regions in which the curve 38 is above the curve 39' denote ranges in which transfer images exhibiting a beam blur of 100 nm or less can be obtained at a beam current of 20 μA.

Figure 3:
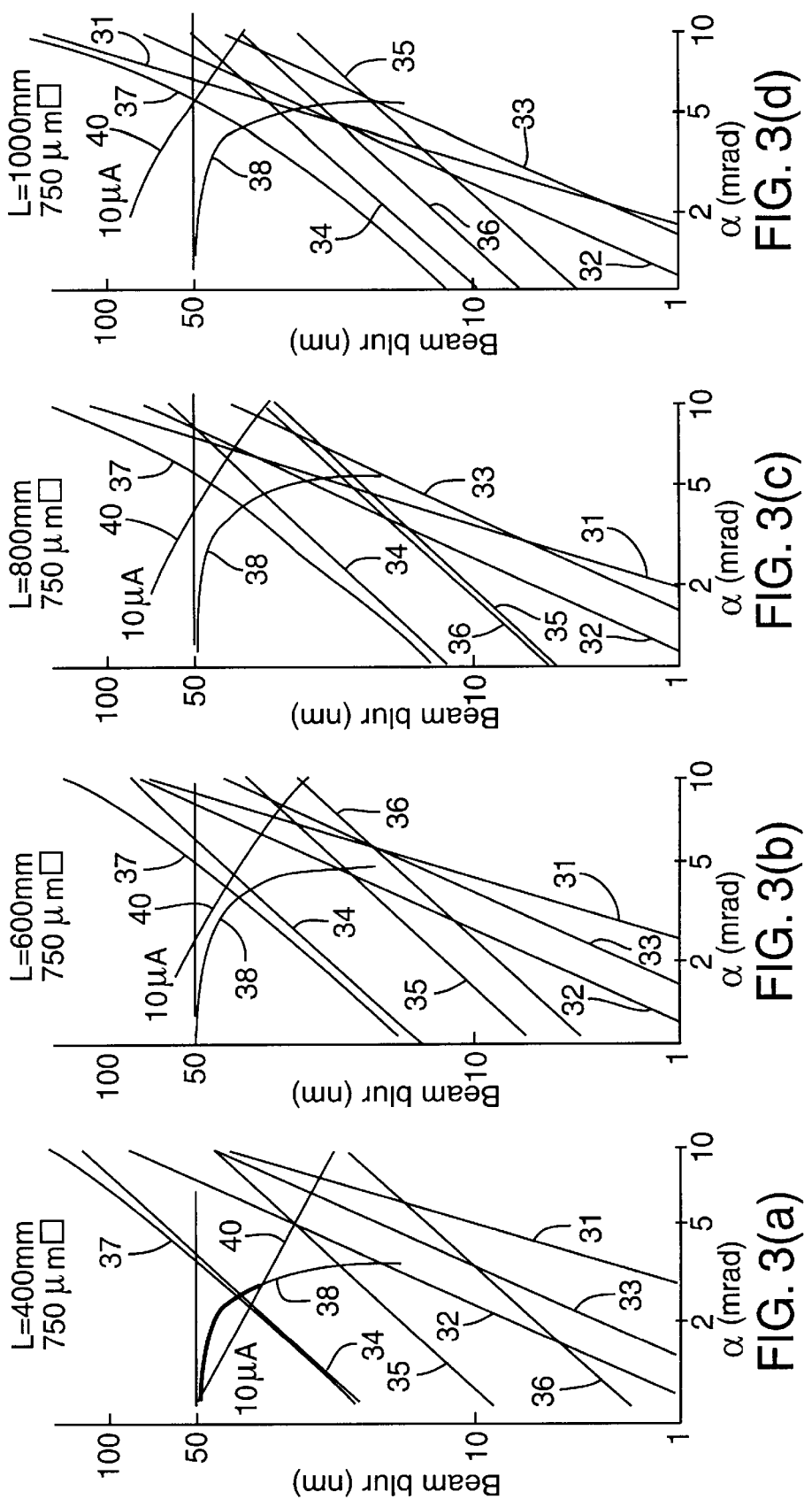
FIGS. 3(a–3(d)) are graphs of results obtained, with a transfer subfield dimension of $(750 \, \mu m)^2$, when the mask-to-substrate distance L is optimized according to the invention.

Optimization of the mask-to-substrate distance L can be performed as follows. Representative results of such optimizations for a subfield dimension of $(750 \mu m)^2$ are shown in FIGS. 3(*a*)–3(*d*), in which the abscissa is the aperture half-angle α (mrad), and the ordinate is the magnitude of beam blurring (nm) of the transferred image, for mask-to-substrate distances (L) of 400 mm, 600 mm, 800 mm, and 1000 mm, respectively. The individual curves are as described above with respect to FIGS. 2(*a*)–2(*d*). The results obtained from a calculation of the electron-electron interaction at a beam current of 10 μA, with a beam-blur specification value of 50 nm, are plotted in each figure as curve 40. The magnitude of the beam blur that can be allowed from electron-electron interactions (curve 38) is larger than the electron-electron interaction (curve 40) only in the case where L=400 mm (shown by the bold portion of the curve 38 in FIG. 3(*a*)). Since the resulting magnitude of blur (that is greater than the magnitude of beam blur that can be allowed from the electron-electron interactions) increases as L becomes greater, the allowable beam current must be decreased in order to adequately control beam blur.

Whereas a beam current of 10 μA can be used to produce 50 nm of beam blur at L=400 mm (FIG. 3(*a*)), it is shown that the deflection field size increases and fifth-order aberrations in the electron-optical system become problematic whenever the main field on the substrate measures 10 mm×1 mm. A prohibitively large and thus impractical number of deflectors (e.g., more than ten deflectors per lens) would be necessary to diminish fifth-order aberrations under such conditions. Repeating the simulation yielded a value for L, at which fifth-order aberrations ceased to be a problem, of greater than 450 mm. Since a beam current of 9 μA can be obtained at L=600 mm, the optimum range for L was concluded to be 450 to 600 mm.

Calculations were performed using a commercially available program (e.g., ABER by Munros Electron Beam Software Ltd., London, England) for diminishing aberrations, with the value for L at 500 mm, and while using six axis-shifting deflectors (three per projection lens) configured as shown in FIG. 1. As a result, a beam current of 10 μA was obtained for a 10 mm×1 mm main field, with 50 nm of beam blur.

Therefore, this invention provides an electron-optical system in which certain parameters are optimized by performing calculations in a short period of time.

Whereas the invention has been described in connection with preferred embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. In an electron-optical system for an electron-beam projection-exposure apparatus that projects a mask pattern, divided into multiple fields, field-by-field onto a substrate, an improvement wherein:

(a) at least one of (i) a mask-to-substrate distance and (ii) a field length-by-width dimension has an optimal value for projection exposure of the mask pattern onto the substrate, the value being determined according to a quantitative relationship of at least one geometric optical aberration exhibited by the electron-optical system with a chromatic aberration exhibited in a single field on an optical axis of the electron-optical system and a space-charge effect exhibited by the electron beam passing through the electron-optical system; and (b) the electron-optical system comprises first and second projection lenses and at least one deflector associated with each projection lens, the at least one deflector being energizable to diminish or cancel off-axis aberrations exhibited by the electron-optical system as the electron-optical system projects a field onto the substrate using the electron beam.

2. The electron-optical system of claim 1, wherein:

the electron beam has a beam current; and the optimal value is determined such that the beam current has a value that is larger than a previously defined beam-current value for a fixed beam blur.

3. The electron-optical system of claim 1, wherein the electron beam has a beam current;

the mask-to-substrate distance is optimized so that the beam current is larger than a previously defined beam-current value for a fixed beam blur and a fixed length-by-width dimension; and the field length-by-width dimension is optimized so that the beam current is larger than a previously defined beam-current value for a fixed beam blur and a fixed mask-to-substrate distance.

4. In an electron-optical system for an electron-beam projection-exposure apparatus that projects a mask pattern, divided into multiple fields, field-by-field onto corresponding transfer fields on a substrate, an improvement wherein:

(a) each of the transfer fields has an area of $(500 \mu m)^2$ to $(750 \mu m)^2$;

(b) an axial distance through the electron-optical system from the mask to the substrate is no greater than 600 mm; and (c) the electron-optical system comprises first and second projection lenses and at least one deflector associated with each projection lens, the at least one deflector being energizable to reduce or cancel off-axis aberrations exhibited by the electron-optical system as the electron-optical system projects a field from the mask to the substrate using the electron beam.

5. The electron-optical system of claim 4, wherein at least one of (i) a mask-to-substrate distance and (ii) a field length-by-width dimension has an optimal value for projection exposure of the mask field onto the substrate, the value being determined according to a quantitative relationship of at least one geometric optical aberration exhibited by the electron-optical system with a chromatic aberration exhibited in a single subfield on an optical axis of the electron-optical system and a space-charge effect exhibited by the electron beam passing through the electron-optical system.

6. The electron-optical system of claim 5, wherein:

the geometric optical aberration is selected from a group consisting of spherical aberration, image-plane distortion, astigmatism, coma radius, and coma length;

the chromatic aberration is selected from a group consisting of axial achromatism and transverse chromatic aberration; and the space-charge effect is beam blur according to an electron-electron impact model simulation.

7. The electron-optical system of claim 4, wherein each deflector is associated with an MOL lens, a VAL lens, an MTP method, or an aberration-cancellation method utilizing multiple deflectors.

8. In an electron optical system for an electron-beam projection-exposure apparatus that projects a mask pattern, divided into multiple fields and each field being divided into multiple subfields, subfield-by-subfield onto corresponding transfer subfields on the substrate by deflecting the electron beam, an improvement wherein:

(a) each field has a dimension of no greater than 10 mm;

(b) each of the transfer subfields has an area of $(500 \mu m)^2$ to $(750 \mu m)^2$;

(c) an axial distance through the electron-optical system from the mask to the substrate is no greater than 600 mm; and (d) the electron-optical system comprises first and second projection lenses and at least one deflector associated with each projection lens, the at least one deflector being energizable to diminish or cancel off-axis aberrations exhibited by the electron-optical system as the electron-optical system projects a subfield from the mask to the substrate using the electron beam.

9. The electron-optical system of claim 8, wherein at least one of (i) a mask-to-substrate distance and (ii) a field length-by-width dimension has an optimal value for projection exposure of each subfield onto the substrate, the value being determined according to a quantitative relationship of at least one geometric optical aberration exhibited by the electron-optical system with a chromatic aberration exhibited in a single subfield on an optical axis of the electron-optical system and a space-charge effect exhibited by the electron beam passing through the electron-optical system.

10. The electron-optical system of claim 9, wherein:

the geometric optical aberration is selected from a group consisting of spherical aberration, image-plane distortion, astigmatism, coma radius, and coma length;

the chromatic aberration is selected from a group consisting of axial achromatism and transverse chromatic aberration; and the space-charge effect is beam blur according to an electron-electron impact model simulation.

11. The electron-optical system of claim 8, wherein each deflector is associated with an MOL lens, a VAL lens, an MTP method, or an aberration-cancellation method utilizing multiple deflectors.

12. An electron-beam projection-exposure apparatus comprising the electron-optical system of claim 1.

13. The projection-exposure apparatus of claim 12, comprising three deflectors per projection lens.

14. An electron-beam projection-exposure apparatus comprising the electron-optical system of claim 4.

15. The projection-exposure apparatus of claim 14, comprising three deflectors per projection lens.

16. An electron-beam projection-exposure apparatus comprising the electron-optical system of claim 8.

17. The projection-exposure apparatus of claim 16, comprising three deflectors per projection lens.

* * * * *

UNITED STATES PATENT AND TRADEMARK OFFICE
CERTIFICATE OF CORRECTION

PATENT NO.    : 6,066,853
DATED         : May 23, 2000
INVENTOR(S)   : Mamoru Nakasuji Page 1 of 1

It is certified that error appears in the above-identified patent and that said Letters Patent is hereby corrected as shown below:

Column 1,
Line 48, change "shot," to -- shot," --
Line 52, change "subfields." to -- "subfields." --

Column 3,
Line 19, change "1000μm)$^2$" to -- (1000μm)$^2$ --.
Line 21, change "3(a-3(d)" to -- 3(a)-3(d) -- as shown in the Application, Page 4, Line 18.

Column 5,
Line 16, change "moving trajectory" to -- moving-trajectory --
Line 21, change "specimen" to -- substrate --.

Column 6,
Line 26, change "a" to -- $\alpha$ --
Line 34, change "half angle" to -- half-angle --
Line 51, change "$\Delta C_s = {}_{1/3}C_s\alpha^3$)." to -- $\Delta C_s = {}_{1/3}C_s\alpha^3$. --

Column 7,
Line 16, change "a" to -- $\alpha$ --.

Column 8,
Line 45, change " wherein" to -- wherein: --.

Signed and Sealed this

Eighteenth Day of September, 2001

*Attest:*

*Attesting Officer*

NICHOLAS P. GODICI
*Acting Director of the United States Patent and Trademark Office*